(12) United States Patent
Joshi

(10) Patent No.: US 7,790,513 B2
(45) Date of Patent: Sep. 7, 2010

(54) SUBSTRATE BASED UNMOLDED PACKAGE

(75) Inventor: Rajeev Joshi, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/358,654

(22) Filed: Jan. 23, 2009

(65) Prior Publication Data

US 2009/0130802 A1    May 21, 2009

Related U.S. Application Data

(60) Continuation of application No. 11/180,405, filed on Jul. 12, 2005, now Pat. No. 7,504,281, which is a division of application No. 10/233,248, filed on Aug. 30, 2002, now Pat. No. 7,061,077.

(51) Int. Cl.
  *H01L 21/00* (2006.01)
(52) U.S. Cl. .................. 438/123; 257/E23.052
(58) Field of Classification Search ......... 438/123; 257/E23.052
  See application file for complete search history.

(56) References Cited

U.S. PATENT DOCUMENTS

| | | | |
|---|---|---|---|
| 3,982,317 A | 9/1976 | Eysermans |
| 4,769,709 A | 9/1988 | Van De Steeg |
| 5,172,214 A | 12/1992 | Casto |
| 5,309,018 A | 5/1994 | Shibata |
| 5,313,092 A | 5/1994 | Tsuruta et al. |
| 5,450,283 A | 9/1995 | Lin et al. |
| 5,528,075 A | 6/1996 | Burns |
| 5,537,075 A | 7/1996 | Miyazaki |
| 5,637,916 A | 6/1997 | Joshi |
| 5,765,280 A | 6/1998 | Joshi |
| 5,777,386 A | 7/1998 | Higashi et al. |
| 5,789,809 A | 8/1998 | Joshi |
| 5,847,458 A | 12/1998 | Nakamura et al. |
| 6,133,634 A | 10/2000 | Joshi |
| 6,143,981 A | 11/2000 | Glenn |
| 6,229,200 B1 | 5/2001 | Mclellan et al. |
| 6,242,281 B1 | 6/2001 | Mclellan et al. |

(Continued)

FOREIGN PATENT DOCUMENTS

JP    H06-132465    5/1994

(Continued)

OTHER PUBLICATIONS

U.S. Appl. No. 11/180,367, filed Jul. 12, 2005, and entitled "Substrate Based Unmolded Package."

(Continued)

*Primary Examiner*—W. David Coleman
*Assistant Examiner*—Sonya D McCall-Shepard
(74) *Attorney, Agent, or Firm*—Townsend and Townsend and Crew LLP

(57) ABSTRACT

A semiconductor die package is disclosed. In one embodiment, the semiconductor die package has a substrate. It includes (i) a lead frame structure including a die attach region with a die attach surface and a lead having a lead surface, and (ii) a molding material. The die attach surface and the lead surface are exposed through the molding material. A semiconductor die is on the die attach region, and the semiconductor die is electrically coupled to the lead.

17 Claims, 5 Drawing Sheets

U.S. PATENT DOCUMENTS

| | | | |
|---|---|---|---|
| 6,249,041 B1 | 6/2001 | Kasem et al. |
| 6,294,403 B1 | 9/2001 | Joshi |
| 6,307,272 B1 | 10/2001 | Takahashi et al. |
| 6,355,502 B1 | 3/2002 | Kang et al. |
| 6,384,472 B1 | 5/2002 | Huang |
| 6,461,900 B1 | 10/2002 | Sundaresan et al. |
| 6,469,384 B2 | 10/2002 | Joshi |
| 6,476,469 B2 | 11/2002 | Hung et al. |
| 6,479,888 B1 | 11/2002 | Hirashima et al. |
| 6,489,678 B1 | 12/2002 | Joshi |
| 6,518,653 B1 | 2/2003 | Takagi |
| 6,630,726 B1 | 10/2003 | Crowley et al. |
| 6,633,030 B2 | 10/2003 | Joshi |
| 6,661,082 B1 | 12/2003 | Granada et al. |
| 6,737,750 B1 | 5/2004 | Hoffman et al. |
| 6,893,901 B2 | 5/2005 | Madrid |
| 7,196,313 B2 | 3/2007 | Quinones et al. |
| 7,439,613 B2 | 10/2008 | Joshi et al. |
| 2002/0066950 A1 | 6/2002 | Joshi |
| 2002/0066959 A1 | 6/2002 | Joshi |
| 2002/0074147 A1 | 6/2002 | Tan et al. |
| 2002/0084511 A1 | 7/2002 | Konishi |
| 2002/0093094 A1 | 7/2002 | Takagawa et al. |
| 2002/0100962 A1 | 8/2002 | Joshi |
| 2002/0163070 A1 | 11/2002 | Choi |
| 2002/0167075 A1 | 11/2002 | Madrid |
| 2002/0177256 A1 | 11/2002 | Lee |
| 2003/0062601 A1 | 4/2003 | Harnden et al. |
| 2003/0146508 A1 | 8/2003 | Chen et al. |
| 2004/0063240 A1 | 4/2004 | Madrid et al. |

FOREIGN PATENT DOCUMENTS

| | | |
|---|---|---|
| JP | H08-250641 | 9/1996 |
| JP | H09-321173 | 12/1997 |
| JP | 2001-210743 A | 8/2001 |
| JP | 2002-076195 | 3/2002 |
| KR | 1998-044247 | 9/1998 |
| KR | 1998-049210 | 9/1998 |
| KR | 1998-0068001 | 10/1998 |
| KR | 10-2001-0052801 | 6/2001 |
| KR | 2002-0045674 | 6/2002 |
| KR | 10-2002-0065046 | 8/2002 |

OTHER PUBLICATIONS

U.S. Appl. No. 11/180,405, filed Jul. 12, 2005, and entitled "Substrate Based Unmolded Package."

U.S. Appl. No. 12/118,222, filed May 9, 2008, and entitled "Substrate Based Unmolded Package."

English Translation of *Notice of Reason for Rejection* for JP Application No. 2004-532833; 4 pages; Transmittal date: Feb. 3, 2009.

Search/Examination Report dated Mar. 9, 2010 from Japanese Application No. 2004-532833, with an English translation, 6 pages.

English Version of "Office Action Summary" from KR Application No. 10-2005-7001655; 3 pages; Mailing date: May 17, 2010.

SUBSTRATE BASED UNMOLDED PACKAGE

CROSS REFERENCE TO RELATED APPLICATIONS

This application is a continuation of U.S. patent application Ser. No. 11/180,405, filed Jul. 12, 2005, now U.S. Pat. No. 7,504,281, entitled "SUBSTRATE BASED UNMOLDED PACKAGE," which is a divisional application of U.S. patent application Ser. No. 10/233,248, filed on Aug. 30, 2002, now U.S. Pat. No. 7,061,077; the disclosures of each are herein incorporated by reference in their entirety for all purposes.

BACKGROUND OF THE INVENTION

Some conventional semiconductor die packages use ceramic substrates. In one example, a ceramic substrate is metallized and has conductive lines and lands. A semiconductor die is mounted on the ceramic substrate to form a semiconductor die package. This semiconductor die package is then mounted on a circuit board.

Other conventional semiconductor packages use lead frames. In one example, a semiconductor die is mounted to a lead frame with leads. Wires couple the semiconductor die to the leads. The wires, the semiconductor die and then the most of the lead frame (except for the leads that extend outward) are then encapsulated in a molding compound. The molding compound is then shaped. The formed semiconductor die package can then be mounted onto a circuit board.

While such semiconductor packages are useful, improvements could be made. For example, semiconductor die packages that use ceramic substrates are relatively expensive to make. Compared to many polymeric materials, ceramic materials are expensive. In addition, both types of semiconductor die packages mentioned above are relatively thick. It would be desirable if the thickness of a semiconductor die package could be reduced. As consumer electronics (e.g., cell phones, laptop computers, etc.) continue to decrease in size, there is an ever increasing demand for thinner electronic devices and thinner electronic components.

Embodiments of the invention address the above problems and other problems individually and collectively.

SUMMARY OF THE INVENTION

Embodiments of the invention are directed to semiconductor packages including substrates and semiconductor dies, and methods for forming the same.

One embodiment of the invention is directed to a semiconductor die package comprising: (a) a substrate comprising (i) a lead frame structure including a die attach region with a die attach surface and a lead having a lead surface (or an area where other methods of interconnect such as solder balls could be attached to form a "leadless package"), and (ii) a molding material, wherein the die attach surface and the lead surface are exposed through the molding material; and (b) a semiconductor die on the die attach region, wherein the semiconductor die is electrically coupled to the lead.

Another embodiment of the invention is directed to a method for processing a lead frame structure, the method comprising: (a) providing a lead frame structure having a die attach surface and a lead surface that is attached to a tape structure, the die attach surface and the gate lead being proximate to the tape structure; (b) depositing a molding material to a side of the lead frame structure opposite the tape structure; (c) solidifying the molding material; and (d) removing the tape structure from the lead frame structure and the solidified molding material, thereby exposing the die attach surface and the lead surface.

Another embodiment of the invention is directed to a method for forming a semiconductor die package comprising: (a) forming a substrate comprising (i) a lead frame structure including a die attach region with a die attach surface and a lead having a lead surface, and (ii) a molding material, wherein the die attach surface and the lead surface are exposed through the molding material; and (b) mounting a semiconductor die on the die attach region and on the die attach surface, wherein the semiconductor die is electrically coupled to the lead after mounting.

Another embodiment of the invention is directed to a method for forming a substrate for a semiconductor die package, the method comprising: (a) providing a lead frame structure including a die attach region with a die attach surface and a lead with a lead surface; and (b) molding a molding material around the lead frame structure, wherein the die attach surface and the lead surface are exposed through the molding material to form the substrate.

These and other embodiments of the invention are described in further detail below.

DETAILED DESCRIPTION

Figure 1:
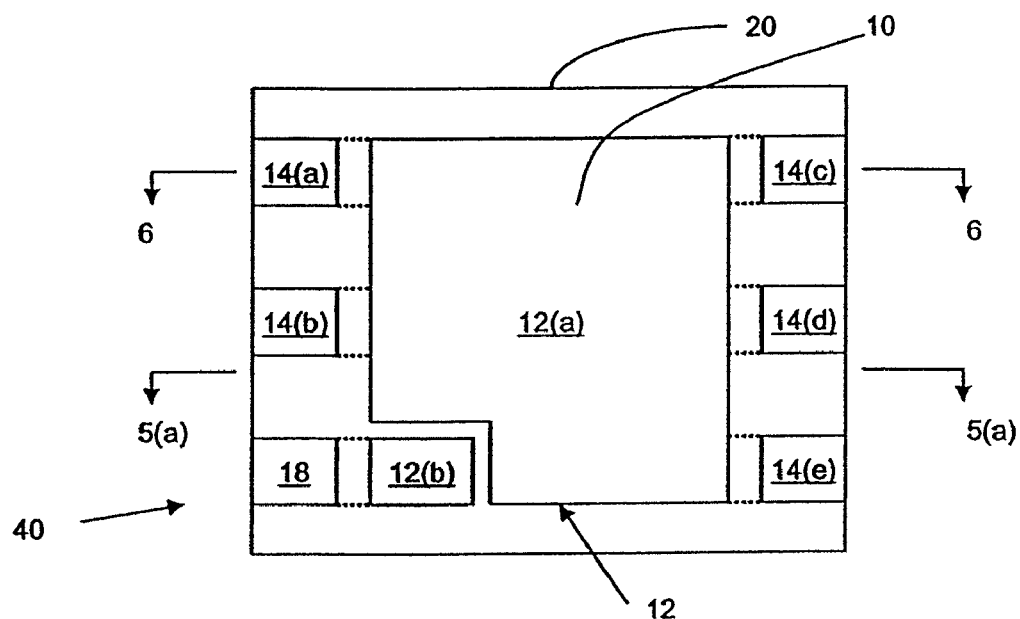
FIG. 1 shows a plan view of a substrate according to an embodiment of the invention.

FIG. 1 shows a substrate 40 according to an embodiment of the invention. The substrate 40 can support a semiconductor die (not shown) in a semiconductor die package.

The substrate 40 includes a lead frame structure 10 and a molding material 20. The term "lead frame structure" can refer to a structure that is derived from a lead frame. Lead frames can be formed by, for example, a stamping process (known in the art). Lead frames can also be formed by etching a continuous conductive sheet to form a predetermined pattern. However, if stamping is used, the lead frame may originally be one of many lead frames in an array of lead frames that are connected together by tie-bars. During the process of making a semiconductor die package, the lead frame array may be cut to separate the lead frame from other lead frames. As a result of this cutting, portions of a lead frame structure in a final semiconductor die package such as a source lead and a gate lead may be electrically and mechanically uncoupled from each other. Thus, in embodiments of the invention, a lead frame structure in a semiconductor die package may be a continuous metallic structure or a discontinuous metallic structure.

The lead frame structure 10 includes a die attach region 12. In this example, the die attach region 12 has a source attach region 12(a) and a gate attach region 12(b). When a semiconductor die (not shown) is on the die attach region 12, the source region and the gate region of a MOSFET (metal oxide semiconductor field effect transistor) would be respectively coupled to the source attach region 12(a) and the gate attach region 12(b). If the MOSFET is a vertical MOSFET (described in detail below), the drain region of the MOSFET would be on the opposite side of the semiconductor die as the source region and the gate region.

For purposes of illustration, the substrate embodiment described above has a source attach region and a gate attach region that are isolated from each other. However, in other embodiments, the substrate could comprise a drain attach region instead of or in addition to a source attach region and a gate attach region. If the semiconductor die comprises a vertical MOSFET, the surface with the drain region of the MOSFET would be coupled to and proximate the substrate, while the source and the gate regions at the other side of the semiconductor die would be distal to the substrate.

In this example, the substrate 40 has five source leads 14(a)-14(e) with corresponding source lead surfaces, and a gate lead 18 with a gate lead surface. Invisible lines show connections under the molding material 20 coupling the five source leads 14(a)-14(e) to the source attach region 12(a). Invisible lines also show the gate lead 18 coupled to the gate attach region 12(b). The gate attach region 12(b) and the source attach region 12(a) are electrically isolated from each other.

The lead frame structure 10 many comprise any suitable material, may have any suitable form, and may have any suitable thickness. Exemplary lead frame structure materials include metals such as copper, aluminum, gold, etc., and alloys thereof. The lead frame structures may also include plated layers such as plated layers of gold, chromium, silver, palladium, nickel, etc. The lead frame structure 10 may also have any suitable thickness including a thickness less than about 1 mm (e.g., less than about 0.5 mm).

The semiconductor dies that are eventually mounted on the substrate 40 may include any suitable semiconductor device. Suitable devices include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

The molding material 20 may comprise any suitable material. Suitable molding materials include biphenyl based materials, and multi-functional cross-linked epoxy resin composite materials. As shown in FIG. 1, the leads 14(a)-14(e), 18 do not extend laterally outward past the molding material 20 so that the substrate 40 can be considered a "leadless" substrate and a package including the substrate could be considered a "leadless" package.

In some embodiments, the molding material may have a dark color (e.g., black). The source attach region 12(a), the source leads 14(a)-14(e), the gate attach region 12(b), and the gate lead 18 may comprise a metallic material (e.g., copper, aluminum) that has good contrast with the molding material 20. The good contrast makes it easier to align and deposit solder or place a semiconductor die on the source attach region 12, the source leads 14(a)-14(e), the gate attach region 12, and the gate lead 18. For example, the improved contrast makes it easier for a machine to automatically deposit solder or automatically pick and place a semiconductor die on the substrate 40. This reduces the likelihood of forming semiconductor die packages that are defective.

As noted, the die attach region 12 includes a source attach region 12(a) and a gate attach region 12(b). In a formed semiconductor die package, a source region and a gate region of a MOSFET can be at the same side of the semiconductor die in the package. The source region and the gate region in the semiconductor die can be respectively coupled to the source attach region 12(a) and the gate attach region 12(b). Solder may be used to electrically couple the semiconductor die to the source attach region 12(a) and the gate attach region 12(b).

As shown in FIG. 1, the gate lead surface of the gate lead 18 and the source lead surfaces of the source leads 14(a)-14(e) are exposed through the molding material 20. Likewise, the surface of the source attach region 12(a) and the surface of the gate attach region 12(b) are exposed through the molding material 20. In this embodiment, the outer surface of the molding material 20 and the exposed surfaces of the source attach region 12(a), the gate attach region 12(b), the gate lead 18, and the source leads 14(a)-14(e), are substantially coplanar.

Figure 2:
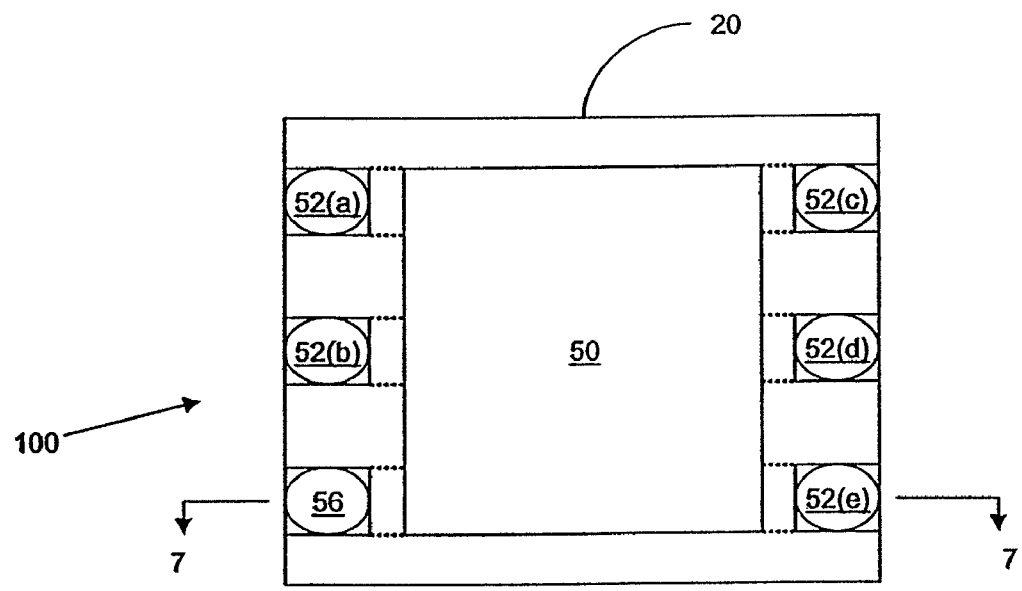
FIG. 2 shows a plan view of a semiconductor die package according to an embodiment of the invention.

FIG. 2 shows a semiconductor die package 100 using the substrate 40 shown in FIG. 1. The semiconductor die package 100 includes a semiconductor die 50 over the die attach region. Solder structures 52(a)-52(e) (e.g., solder balls) are respectively deposited on the source leads 14(a)-14(e). Another solder structure 56 is deposited on the gate lead 18. The solder structures 52(a)-52(e), 56 can be formed using any suitable process including screen printing, ball attach, pick and place processes, etc.

After depositing the solder structures 52(a)-52(e), 56 and mounting the semiconductor die 50 on the substrate 40, the semiconductor die package 100 can be flipped over and then mounted onto a circuit board.

Figure 3:
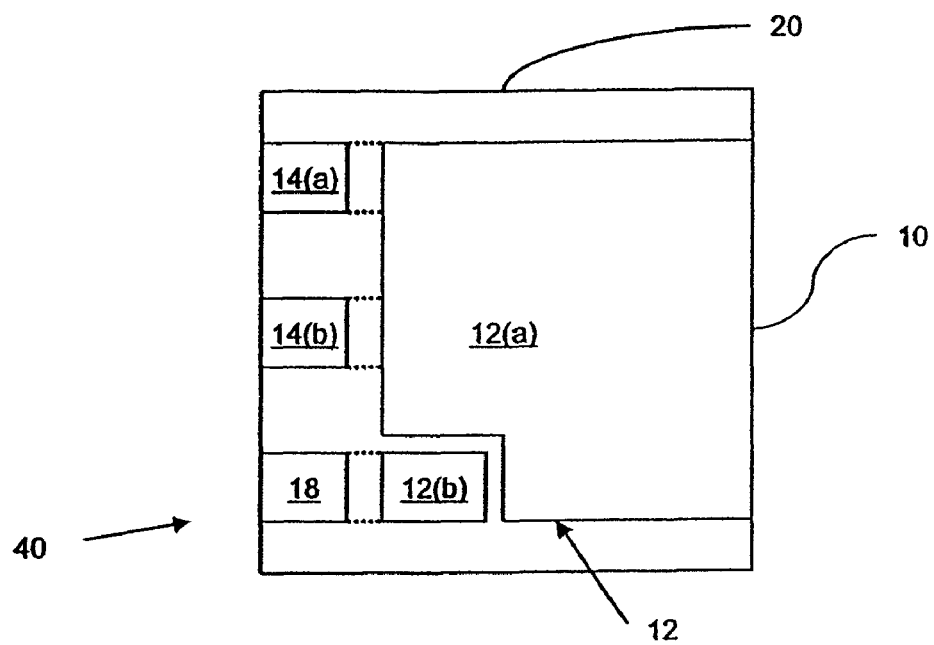
FIG. 3 shows a plan view of a substrate according to an embodiment of the invention.
Figure 4:
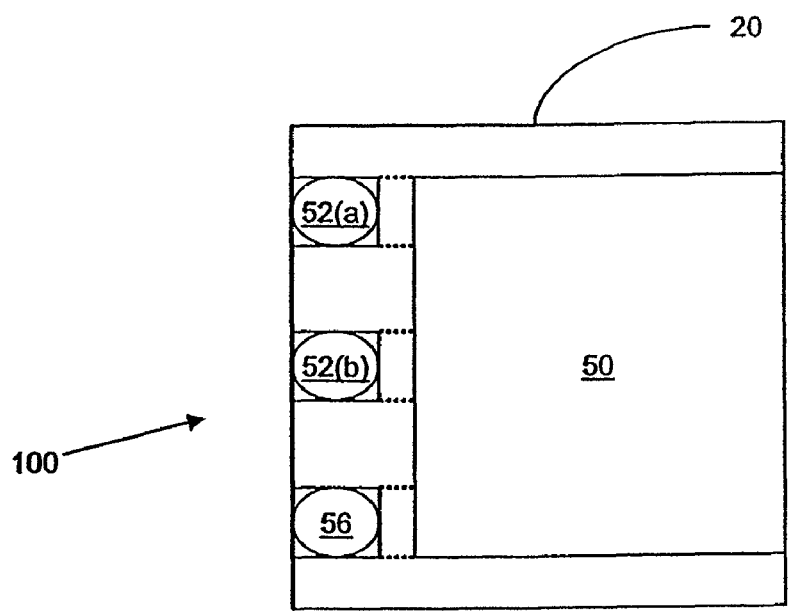
FIG. 4 shows a plan view of a semiconductor die package according to an embodiment of the invention.

FIGS. 3 and 4 respectively show a substrate and a semiconductor die package according to another embodiment of the invention. In FIGS. 1 to 4, like numerals designate like elements. The embodiments in FIGS. 3 and 4 are similar to the elements in FIGS. 1 and 2, except that in the embodiments shown in FIGS. 3 and 4, there are fewer source leads and corresponding solder structures. In comparison to the embodiments in FIGS. 1 and 2, the areas of the substrate and semiconductor die package in FIGS. 3 and 4 are smaller. As shown by the different embodiments in FIGS. 1-4, embodiments of the invention may have any suitable number of source leads and drain leads.

Figure 5A:
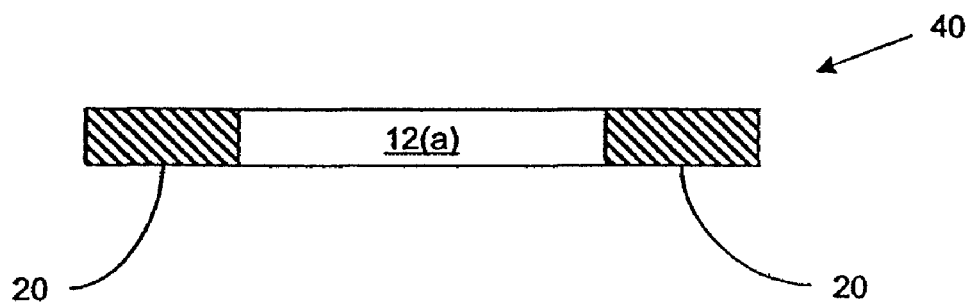
FIG. 5(a) shows a cross-sectional view of a substrate according to an embodiment of the invention along the line 5(a)-5(a) in FIG. 1.

FIG. 5(a) shows a cross-sectional view of the substrate 40 along the line 5(a)-5(a) shown in FIG. 1. FIG. 5(a) shows a substrate where the opposing major surfaces of a source attach region 12(a) are exposed through the molding material 20. In this embodiment, the thickness of the molding material 20 can be substantially equal to the thickness of the lead frame structure. Parts of the top and bottom surface of a lead frame structure can be exposed through the molding material 20.

Figure 5B:
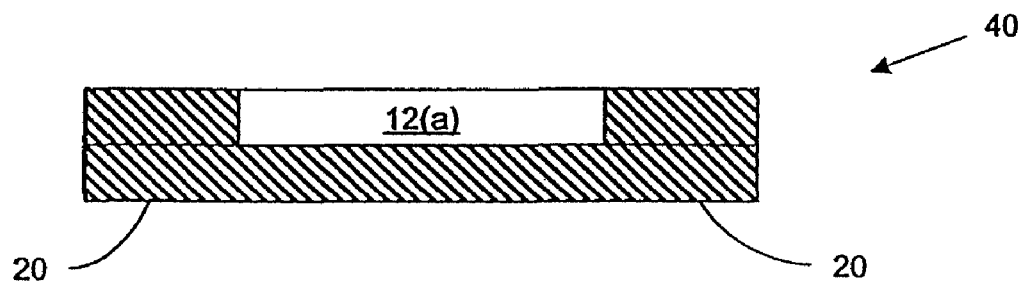
FIG. 5(b) shows a cross-sectional view of a substrate according to an embodiment of the invention.

FIG. 5(*b*) shows yet another embodiment of the invention. In FIG. 5(*b*), the source attach region 12(*a*) of the die attach region is shown and the molding material 20 exposes the source attach region 12(*a*). Unlike the embodiment shown in FIG. 5(*a*), the molding material 20 covers the sides and the bottom surface of the lead frame structure.

The substrate embodiment shown in FIG. 5(*a*) is thinner than the substrate embodiments shown in FIG. 5(*b*). This may be desirable if, for example, the formed semiconductor die package is to be used in a thin device such as a wireless phone or a laptop computer.

Figure 6:
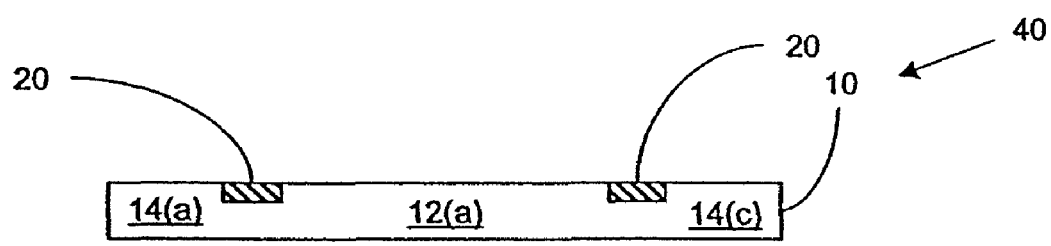
FIG. 6 shows a cross-sectional view of the substrate in FIG. 1 along the line 6-6.

FIG. 6 shows a side view of the substrate 40 shown in FIG. 1 along the line 6-6. As shown, the lead frame 10 includes a source attach region 12(*a*), and two source leads 14(*a*), 14(*c*). Molding material 20 is disposed in grooves in the lead frame 10. The molding material 20 in the grooves can help to selectively expose the source leads 14(*a*), 14(*b*).

Figure 7:
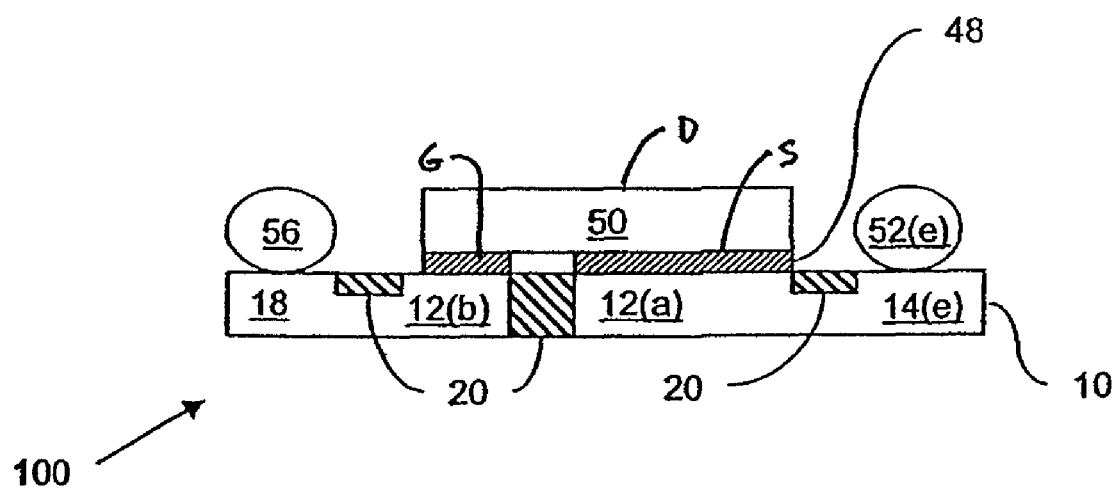
FIG. 7 is a side cross-sectional view of a semiconductor die package in FIG. 2 along the line 7-7.

FIG. 7 shows the semiconductor die package 100 shown in FIG. 2 from a side cross-sectional view along the line 7-7. The semiconductor die package 100 includes a semiconductor die 50 mounted on a source attach region 12(*a*) and a gate attach region 12(*b*) of a lead frame structure 10 through a layer of solder 48. The layer of solder 48 in this embodiment is discontinuous so the gate and source regions in the die 50 do not short out. Solder balls 52(*e*), 56 are respectively on the source lead 14(*e*) and the gate lead 18. Molding material 20 is in a grooves in the lead frame structure 10 between the solder balls 52(*e*), 56, and the semiconductor die 50. Molding material 20 is also between the source attach region 12(*a*) and the gate attach region 12(*b*) to electrically isolate the gate current and source current passing to the semiconductor die 50.

Figure 8:
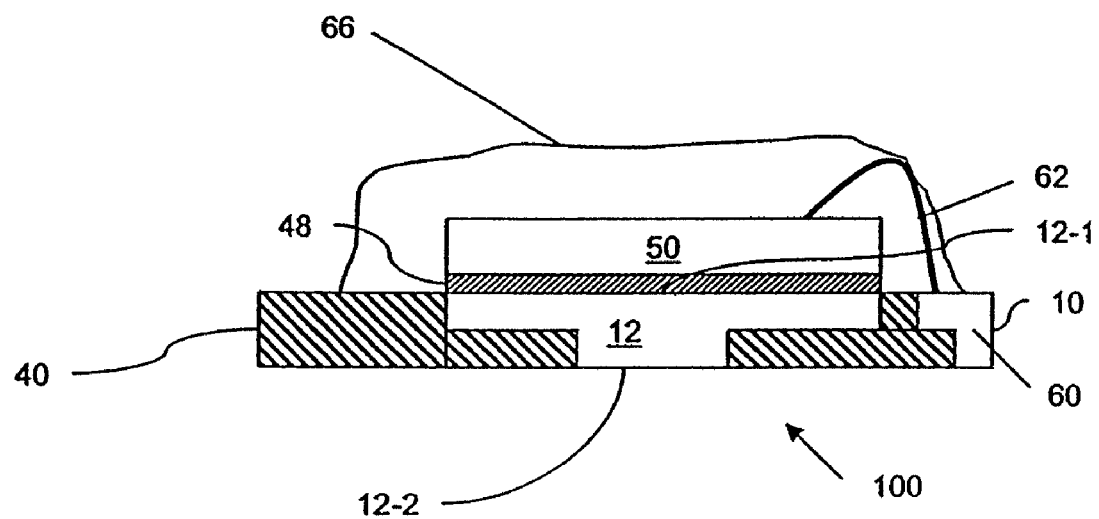
FIG. 8 is a side cross-sectional view of another semiconductor die package according to an embodiment of the invention.

FIG. 8 shows a semiconductor die package 100 according to another embodiment of the invention. The semiconductor die package 100 includes a semiconductor die 50 on a substrate 40. The semiconductor die 50 can include a source region and a gate region at the upper surface of the semiconductor die 50, and a drain region its lower surface. A wire 62 can couple, for example, the source region in the semiconductor die 50 to a source lead 60. Another wire (not shown) could couple the gate region of the semiconductor die 50 to a gate lead (not shown).

An encapsulating material 66 covers the semiconductor die 50 and the wire 62 to protect these components. In some embodiments, the encapsulating material 66 may be different than the molding material 20. Any suitable encapsulating material may be used. Suitable encapsulating materials include bi-phenyl materials, and multi-functional cross-linked epoxy resin composites.

The substrate 40 includes a lead frame 12 with a first surface 12-1 proximate to the semiconductor die 50 and a second surface 12-2 distal to the semiconductor die 50. The first surface 12-1 has a greater area than the second surface 12-2. By reducing the size of the second surface, the package 100 can be mounted on a conductive land of an appropriate size on a circuit board.

Any suitable process can form the reduced-area second surface 12-2. For example, a photolithography process can be used to print a photoresist pattern on a metallic structure such as a lead frame. A suitable etchant can then be used to etch the metal structure to the appropriate depth to form the reduced-area second surface 12-2 of the lead frame structure. Photolithography and etching processes are well known in the art.

Unlike the previous embodiments, the semiconductor die package 100 shown in FIG. 8 can be mounted on a circuit board without flipping it over. That is, when the semiconductor die package 100 is mounted on a circuit board, the surface 12-2 is closer to the circuit board than the surface 12-1.

The substrates according to embodiments of the invention could be used in devices other than purely electrical devices. For example, embodiments of the invention could be used in optocoupler packages. Optocoupler packages contain at least one optical emitter device which is optically coupled to an optical receiver device through an optically transmissive medium. The optical emitter device and the optical receiver device can be on a substrate (like the ones described above). This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is useful because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit. Examples of suitable optocoupler devices are described in U.S. patent application Ser. No. 09/944,717, which was filed on Aug. 31, 2001, and is assigned to the same assignee as the present application. This U.S. patent application is herein incorporated by reference in its entirety for all purposes.

Figure 9:
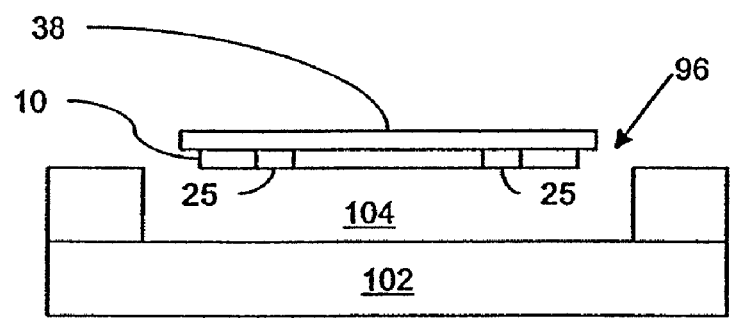
FIG. 9 shows a side cross-sectional view of a tape structure attached to a lead frame structure, as it would be placed in mold cavity in a mold.

FIG. 9 shows how the substrate can be formed in an embodiment of the invention. In this embodiment, a lead frame structure 10 (alone in the form of a lead frame or with other lead frames in an array) is adhered to an adhesive side of a tape structure 18. This combination is then placed in a mold cavity 104 of a mold 12. Molding compound (in liquid or semi-liquid form) is then introduced into the molding chamber under the lead frame structure 10 as indicated by the numeral 96 and the molding compound passes upward and fills the interstices 25 in the lead frame structure 10. Once the molding compound solidifies, the tape structure 38, the lead frame 10, and the molding compound can be removed from the mold 12. If a substrate such as the one shown in FIG. 5(*a*) is to be formed, excess molding compound could be removed from the side of the lead frame structure 10 opposite the tape structure 38 before or after it is solidified. The tape structure 38 can then be separated from the formed substrate. The metal surfaces that were in contact with the tape structure 38 are exposed through the solidified molding compound. This process can be an example of a "tape-assisted single sided molding process."

In another embodiment, instead of using a mold, it is possible to screen-print a molding material into the interstices of a lead frame structure. For example, a lead frame structure can be placed on a surface (or tape). A squeegee or other device may be used to spread molding material into the interstices of a lead frame structure. Excess molding compound can then be removed (e.g., with a squeegee) if desired. The molding material can solidify and the lead frame structure can be separated from the surface. The portions of the lead frame structure that previously contacted the surface would be free of molding material and would thus be exposed through the solidified molding material. Additionally, dejunk and deflash processes (known in the art) may be performed to remove excess molding compound.

After a substrate is formed, the rest of the process for forming the semiconductor package can include processes such as solder dispense, solder ball attach, flip chip die attach, and then reflowing the solder balls so that the semiconductor die is attached to the substrate.

Before or after mounting a semiconductor die to a lead frame, the lead frame structure may be partially cut to isolate the leads for testing. For example, referring to FIG. 1, the source leads 14(a)-14(e) and the gate lead 18 may be part of a single lead frame structure 10 within an array of lead frames. Initially, the lead frame structure 10 may be mechanically coupled together through an outer frame-like element through "tie-bars" (not shown) extending outward from each lead 14(a)-14(e), 18. After the substrate is formed, the tie bar (not shown) to the gate lead 18 can be cut to isolate the gate lead 18 from the source leads 14(a)-14(e). The substrate can then be electrically tested before it is separated from other substrates.

If the substrate passes testing, then the semiconductor die packages in an array of semiconductor die packages can be separated from each other in a singulation process (e.g., using a saw). A tape and a reel process, which is well known in the art, can then follow the singulation process. Advantageously, form factor dedicated tooling that trims and forms moldings is not required in embodiments of the invention.

Embodiments of the invention have a number of other advantages. First, as noted above, in embodiments of the invention, a lead frame structure is used in a substrate. Lead frame structures are inexpensive and are easy to fabricate. Thus, a substrate according to embodiments of the invention can be made quite inexpensively. For example, the cost of a substrate made according to embodiments of the invention can be reduced by about 70% or more as compared to a ceramic metallized substrate. Second, the substrates according to embodiments of the invention have high contrast between the molding material and the exposed areas of the lead frame structure. As explained in further detail above, this results in fewer defects. Third, embodiments of the invention can be made thinner than conventional semiconductor die packages and substrates. The package size of embodiments of the invention can be reduced by at least 20% over current state of the art packages. For example, the thickness of a semiconductor die package according to an embodiment of the invention can be on the order of about 0.5 mm (or less). Fourth, in embodiments of the invention, the molding process is form factor independent since it is used to construct substrates, and need not be used to completely encapsulate the semiconductor die. Fifth, the substrates and packages of embodiments of the invention can be mounted using well known "flip-chip" techniques. Sixth, in embodiments of the invention, it is possible to etch fine geometries in a lead frame structure so that the package leads and the die attach surface can be customized according to needs. Seventh, the substrates according to embodiments of the invention are mechanically quite rigid, yet flexible enough to be handled in highly automated equipment.

Also, in embodiments of the invention, it is possible to pre-mold a lead frame to form a substrate, and then this substrate can be assembled (with a die) to form a package. Advantageously, very thin lead frames can be etched or stamped. For example, one can take a copper foil about 4 mils thick, punch it or etch it to a desired pattern, and then mold it into a substrate about 6 to 8 mils thick. The formed substrate can now can be easily handled in conventional assembly equipment (e.g., a flip chip bonder). As compared to conventional plating processes, embodiments of the invention reduce processing time and increase the ease of manufacture. For example, copper plates at about 4-8 microns/min. To obtain a 4 mil thick trace of copper would normally take about 30 to 40 minutes. Embodiments of the invention take less time to produce since a pre-formed lead frame can be used to form a substrate.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, it is understood that a substrate of the type shown in FIG. 5(b) could be used in the semiconductor die package embodiments shown in FIGS. 2 and 4.

What is claimed is:

1. A method for forming a semiconductor die package comprising:
    foaming a substrate comprising a lead frame structure including a lead having a lead surface, a molding material, a substantially planar first side comprising an active surface and a second side, wherein the lead surface is exposed through and is substantially coplanar with an exterior surface of the molding material; and
    mounting a semiconductor die on the first side, wherein the semiconductor die is electrically coupled to the lead after mounting.

2. The method of claim 1 wherein the semiconductor die comprises a vertical power MOSFET.

3. The method of claim 1 wherein forming the substrate includes using a tape-assisted single sided molding process.

4. The method of claim 1 wherein the semiconductor die comprises an optical device.

5. The method of claim 1 further comprising attaching a wire to the semiconductor die and the substrate.

6. The method of claim 1 wherein the molding material comprises an epoxy molding material.

7. The method of claim 1 wherein the lead is a source lead and wherein the lead frame structure further comprises a gate lead.

8. The method of claim 1 further comprising attaching a solder ball to the lead.

9. The method of claim 1 wherein the leadframe structure comprises a plated layer.

10. The method of claim 1 wherein the molding material comprises a cross-linked epoxy material.

11. The method of claim 1 wherein the package is a leadless package.

12. The method of claim 1 wherein the lead does not extend past a lateral surface of the molding material.

13. The method of claim 7 further comprising attaching solder structures to the source lead and the gate lead.

14. A method for forming an assembly comprising:
    forming a semiconductor die package according to the method of claim 8; and
    flipping the semiconductor die package over and mounting the semiconductor die package to a circuit board.

15. The method of claim 14 wherein the semiconductor die comprises a vertical MOSFET.

16. The method of claim 14 wherein the lead frame structure comprises copper.

17. The method of claim 16 wherein the leadframe structure comprises a plated layer.

* * * * *

UNITED STATES PATENT AND TRADEMARK OFFICE
CERTIFICATE OF CORRECTION

PATENT NO. : 7,790,513 B2  Page 1 of 1
APPLICATION NO. : 12/358654
DATED : September 7, 2010
INVENTOR(S) : Rajeev Joshi It is certified that error appears in the above-identified patent and that said Letters Patent is hereby corrected as shown below:

Col. 8, Ln. 20
Claim 1, line 3, please correct "foaming" to --forming--.

Signed and Sealed this

Sixteenth Day of November, 2010

David J. Kappos
*Director of the United States Patent and Trademark Office*